United States Patent [19]
Lin et al.

[11] Patent Number: 5,492,868
[45] Date of Patent: Feb. 20, 1996

[54] CAPPED REFLOW PROCESS TO AVOID CONTACT AUTODOPING AND SUPRESS TUNGSTEN SILICIDE PEELING

[75] Inventors: Ting H. Lin; Chung-An Lin; Chih-Heng Shen, all of Hsin-Chu, Taiwan

[73] Assignee: Taiwan Semiconductor Manufacturing Corp. Ltd., Hsinchu, Taiwan

[21] Appl. No.: 327,587

[22] Filed: Oct. 24, 1994

[51] Int. Cl.$^6$ ................................................. H01L 21/465
[52] U.S. Cl. ...................... 437/228; 437/195; 437/235; 437/982
[58] Field of Search ........................ 437/984, 195, 437/228, 231, 235, 982; 148/DIG. 20

[56] References Cited

U.S. PATENT DOCUMENTS

| | | | |
|---|---|---|---|
| 4,863,563 | 9/1989 | Scardera et al. | 156/662 |
| 5,089,432 | 2/1992 | Yoo | 437/40 |
| 5,284,800 | 2/1994 | Lien et al. | 437/195 |
| 5,344,797 | 9/1994 | Pai et al. | 437/238 |
| 5,354,715 | 10/1994 | Wang et al. | 437/238 |

OTHER PUBLICATIONS

"Si/W Ratio Changes and Film Peeling During Polycide Anneal" by C. S. Yoo, Japanese Journal of Applied Physics, vol. 29, Nov. 1990, pp. 2535–2540.

*Primary Examiner*—George Fourson
*Assistant Examiner*—H. Jey Tsai
*Attorney, Agent, or Firm*—George O. Saile; Larry Prescott

[57] ABSTRACT

This invention provides a method of preventing contact autodoping and supressing tungsten silicide peeling during the reflow cycle for a borophosphosilicate glass insulating layer during fabrication of large scale integrated circuits. The invention uses a thin oxide layer to protect the contact areas during the reflow cycle. The thin oxide layer is thin enough to allow satisfactory reflow of the borophosphosilicate glass insulating layer and thick enough to prevent autodoping and tungsten silicide peeling. The thin oxide layer is also thin enough so that process time required to remove the thin oxide layer is not a significant increase in process time. The thin oxide layer thickness is controlled by depositing a helium diluted tetraethoxysilane vapor and oxygen using chemical vapor deposition.

4 Claims, 2 Drawing Sheets

CAPPED REFLOW PROCESS TO AVOID CONTACT AUTODOPING AND SUPRESS TUNGSTEN SILICIDE PEELING

BACKGROUND OF THE INVENTION

(1) Field of the Invention

The invention relates to the prevention of contact autodoping and tungsten silicide peeling during the reflow cycle for a borophosphosilicate glass, or BPSG, insulating layer. The contact autodoping and tungsten silicide peeling are avoided by means of a thin oxide layer which protects contact areas during the reflow cycle.

(2) Description of Related Art

The problem of autodoping during the BPSG reflow cycle has been addressed by others. A flow of oxygen gas can be introduced during the reflow cycle to form a $SiO_2$ layer on the contacts can prevent autodoping but will cause peeling of tungsten silicide due to depletion of the silicon in the tungsten silicide layer. The tungsten silicide layer has gone through several thermal cycles due to process requirements prior to the reflow cycle resulting in serious silicon depletion.

As deposited the tungsten silicide layer is $WSi_{2.6-2.7}$ and after tungsten silicide annealing, which is necessary to reduce the resistance of the tungsten silicide layer the tungsten silicide layer becomes $WSi_{2.3-2.4}$. If the tungsten silicide layer is exposed to an oxidizing environment oxidation depletes silicon from the tungsten silicide layer which becomes $WSi_{2.2}$. These changes affect the crystal structure of the tungsten silicide and cause stress increases which result in peeling of the tungsten silicide.

Changes in the $WSi_x$ film are discussed in the paper "Si/W Ratio Changes and Film Peeling During Polycide Anneal," by C. S. Yoo, Japanese Journal of Applied Physics, vol. 29, Nov. 1990, pages 2535–2540. U.S. Pat. No. 5,089,432 to C. S. Yoo provides a method for capping tungsten silicide with a thin oxide layer.

This invention uses a thin oxide layer to protect contact areas during the BPSG reflow cycle. The thickness of the oxide layer is an important part of the invention as it must be thin enough to allow the BPSG reflow to occur as well as not impact subsequent processing, such as pre-metal contact etch time prior to first metal sputtering, and thick enough to protect the contact areas during the reflow cycle.

SUMMARY OF THE INVENTION

It is a principle object of this invention to provide a means to prevent peeling of a $WSi_x$ layer formed on a polysilicon electrode caused by the reflow cycle for an insulating layer such as borophosphosilicate glass.

It is also a principle object of this invention to prevent contact autodoping at the source/drain areas of field effect transistors during the reflow cycle for an insulating layer such as borophosphosilicate glass.

These objectives are achieved by forming a thin oxide layer over the surface of a semiconductor substrate having source/drain regions formed therein and a gate dielectric layer, a polysilicon gate electrode, and an insulating dielectric layer formed thereon. A $WSi_x$ layer is formed on the surface of the polysilicon gate electrode to improve the contact resistance of the gate electrode. Contact openings are formed in the insulating dielectric layer, formed of a material such as borophosphosilicate glass, for electrical contact to the gate electrode and the source/drain regions. In processing without covering the source/drain and gate electrode areas exposed by the contact openings in the borophosphosilicate glass, or BPSG, they can be seriously damaged during the BPSG reflow cycle. Autodoping from the BPSG can occur during the reflow cycle where temperatures of between about 850° C. and 950° C. are reached.

This autodoping can be prevented by flowing $O_2$ gas to oxidize the source/drain contact areas during the reflow process but this will also oxidize the gate electrode contact area. This oxidation of the gate electrode contact area, forming $SiO_2$, will further deplete Si from the $WSi_x$ layer causing peeling of the $WSi_x$. As deposited the tungsten silicide layer is $WSi_{2.6-2.7}$ and after tungsten silicide annealing, which is necessary to reduce the resistance of the tungsten silicide layer the tungsten silicide layer becomes $WSi_{2.3-2.4}$. If the tungsten silicide layer is exposed to an oxidizing environment oxidation depletes silicon form the tungsten silicide layer which becomes $WSi_{2.2}$. These changes affect the crystal structure and cause stress increase which results in peeling of the tungsten silicide.

The thin oxide layer described in this invention is formed over the surface of the semiconductor substrate prior to the BPSG reflow cycle, protecting the source/drain and gate electrode contact areas during the reflow. The thickness of the thin oxide layer is a critical feature of the invention and is between about 80 and 120 Angstroms. This thickness of the thin oxide layer must be thick enough to prevent autodoping of the source/drain contact areas and thin enough to allow the desired reflow of the BPSG to occur. It is also desirable that the thin oxide layer be thin enough to be removed during the pre-metal contact etch without significantly increasing the etching time.

Depositing the thin oxide layer to a thickness of between about 80 and 120 Angstroms is a key feature of this invention. This is accomplished by using helium to dilute tetraethoxysilane, or TEOS, vapor and using chemical vapor deposition of the diluted TEOS vapor and oxygen. When buffered HF is used as the etchant for the pre-metal contact etch the etching time is not significantly increased to remove the thin oxide layer. For a thin oxide layer thickness of between about 80 and 120 Angstroms the pre-metal contact etch time can be kept the same as for the conventional process. An increase in pre-metal contact etch time will change the contact profile and avoiding significant increase in this etch time is important.

DESCRIPTION OF THE PREFERRED EMBODIMENTS

Refer now to FIG. 1 through FIG. 4, there is shown the preferred embodiment of the process for a capped reflow to avoid contact autodoping and to prevent $WSi_x$ peeling. While the specific embodiment described herein uses an N channel MOSFET device structure, it will be apparent to those skilled in the art that the invention is applicable to different types of device structures such as P channel MOSFET, CMOS or bipolar structures.

Figure 1:
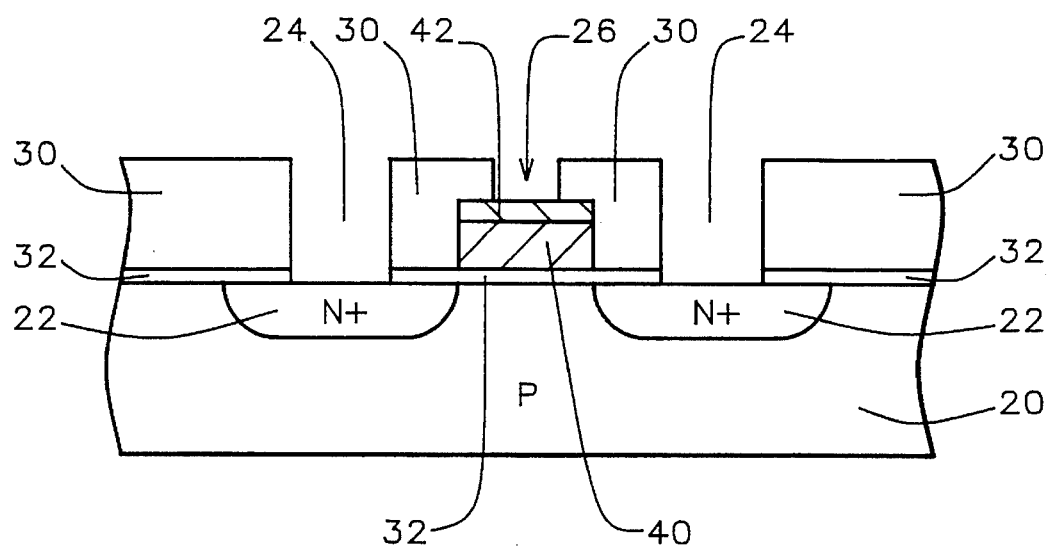
FIG. 1 is a cross section view of the integrated circuit device showing the semiconductor substrate, the source/drain regions, the gate dielectric layer, the polysilicon gate electrode, the $WSi_x$ layer on the polysilicon gate electrode, and the insulating dielectric layer.

FIG. 1 shows a cross section of a semiconductor substrate 20 with source/drain regions 22, a gate oxide layer 32, and a polysilicon gate electrode 40 all formed using conventional processing. An example of such conventional processing is described in the book "VLSI PROCESS TECHNOLOGY" Second Edition, by S. M. Sze, published by McGraw-Hill Book Co., New York, N.Y., 1988, Pages 238–247 and 466–512. A $WSi_x$ layer 42, with as deposited x between about 2.6 and 2.7, is formed on the polysilicon gate electrode 40 using low pressure chemical vapor deposition with a thickness of between about 1200 and 3000 Angstroms. An insulating layer of borophosphosilicate glass 30, or BPSG, is then formed over the semiconductor substrate by means of conventional methods such as chemical vapor deposition. Contact openings are etched in the BPSG layer and gate oxide layer for source/drain contacts 24 and in the BPSG layer for the gate electrode contact 26 using an etchant such as $CF_4$ or $C_2F_6$ with Ar.

Figure 2:
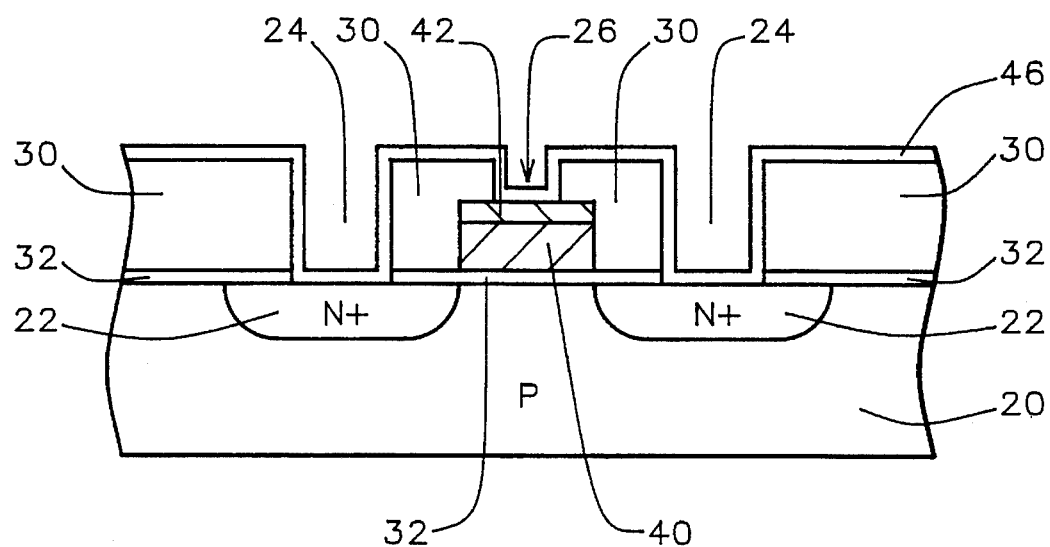
FIG. 2 is a cross section view of the integrated circuit device before the reflow cycle showing the thin oxide layer formed over the entire surface.

Next, as shown in FIG. 2, a thin oxide layer 46, such as $SiO_2$, with a thickness of between about 80 and 120 Angstroms is formed over the entire substrate surface. The thickness of the thin oxide layer is not only very thin but a very important feature of this invention. The thin oxide layer is deposited by chemical vapor deposition of helium diluted tetraethoxysilane, TEOS, vapor and $O_2$. The helium diluted TEOS vapor is between about two and three parts helium to about one part TEOS. The thin oxide layer formed by this means can be well controlled within the 80 to 120 Angstrom thickness range. The thin oxide layer covers the entire exposed substrate surface including the source/drain contact areas and the gate electrode contact area.

Figure 3:
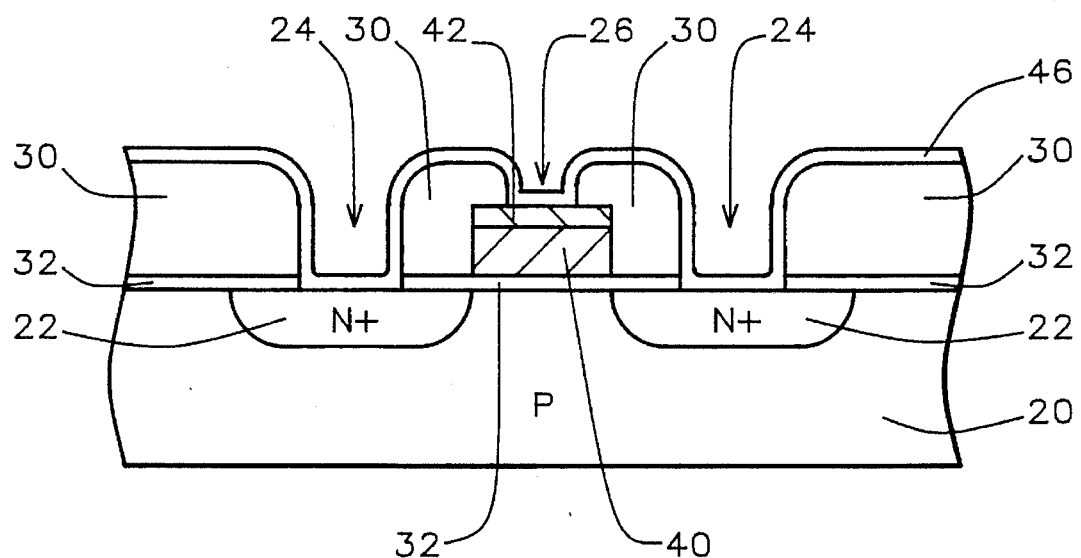
FIG. 3 is a cross section view of the integrated circuit device after the reflow cycle showing the softened edges of the insulating dielectric layer.

Next, as shown in FIG. 3, the borophosphosilicate glass, or BPSG, is reflowed at a temperature between about 850° C. and 950° C. for between about 30 and 60 minutes. As shown in FIG. 3 the sharp edges 52 of the BPSG are softened by the reflow cycle. The thin oxide layer must be thin enough to allow the BPSG to flow during the reflow cycle so the softening of the sharp edges can occur. During the reflow cycle the thin oxide layer at the source/drain openings 24 prevents autodoping of the source/drain regions with boron or phosphorous from the BPSG. The thin oxide layer must be thick enough to prevent autodoping from occurring. If the source/drain openings were not covered boron or phosphorous from the BPSG could diffuse into the source/drain regions through the source/drain openings causing autodoping. The thin oxide layer also protects the $WSi_x$ layer at the gate electrode opening 26 during the BPSG reflow cycle. If the gate electrode opening were not covered during the BPSG reflow cycle surface oxidation would cause further loss of Si from the $WSi_x$ layer which would result in peeling of the $WSi_x$ layer. The thin oxide layer must be thick enough to prevent autodoping at the source/drain contact area and surface oxidation of the $WSi_x$ layer ant at the same time be thin enough to allow the BPSG layer to flow during the reflow cycle. These requirements make the thin oxide layer thickness of between about 80 and 120 Angstroms key to the invention. The thin oxide layer thickness of between about 80 and 120 Angstroms is thick $WSi_x$ layer and thin enough to allow the BPSG layer to flow enough to prevent autodoping and surface oxidation of the during the reflow cycle.

Next a pre-metal contact etch, using an etchant such as 50:1 buffered HF, for about 20 to 40 seconds is used prior to forming the metal contacts at the source/drain and gate electrode contact areas. This etching process is also used to remove the thin oxide layer from the substrate. The thin oxide layer increases the time required for pre-metal contact etch cycle by about 30 seconds to remove a thin oxide layer of between about 80 and 120 Angstroms thick using HF as the etchant for the pre-metal contact etch.

Figure 4:
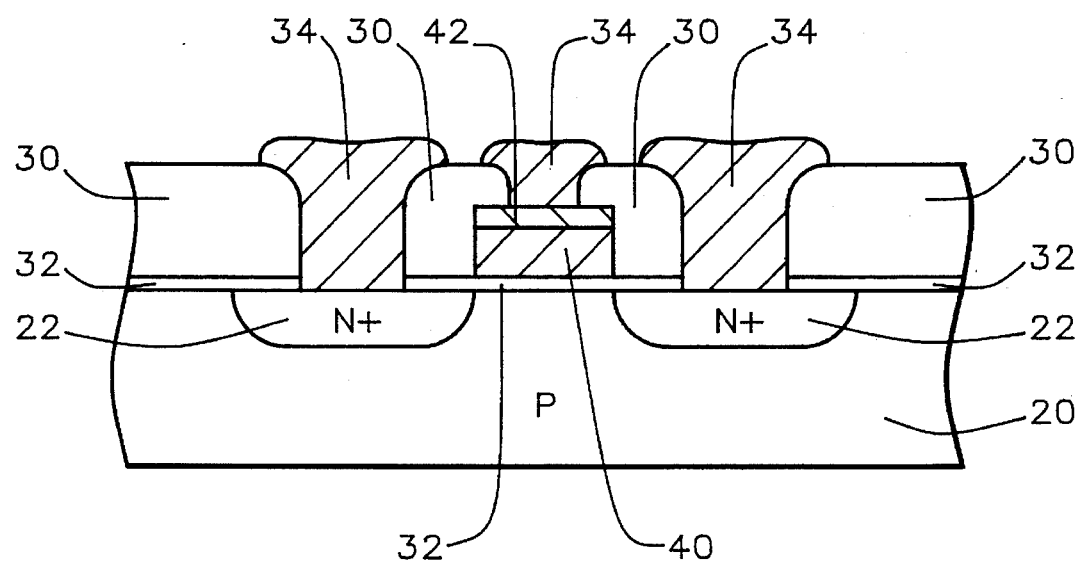
FIG. 4 is a cross section view of the integrated circuit device after the thin oxide layer has been etched away and the metal contacts have been formed.

Next, as shown in FIG. 4, metal contacts are formed at the source/drain contact areas 34 and the gate electrode contact 36, patterned metal electrodes are formed onto the substrate, and the device is completed using conventional processing. Examples of such conventional processing are described in the previously cited book by S. M. Sze.

While the invention has been particularly shown and described with reference to the preferred embodiments thereof, it will be understood by those skilled in the art that various changes in form and details may be made without departing from the spirit and scope of the invention.

What is claimed is:

1. A method of forming integrated circuits, comprising the steps of:

providing a semiconductor substrate with devices formed therein;

providing a gate dielectric layer formed on said semiconductor substrate;

providing a polysilicon gate electrode formed on said gate dielectric layer;

forming a tungsten silicide layer on said polysilicon gate electrode;

forming a doped insulating dielectric layer with contact openings formed therein over said semiconductor substrate;

forming an oxide layer over said doped insulating dielectric layer with contact openings wherein said oxide layer is formed using chemical vapor deposition of helium diluted tetraethoxysilane vapor and $O_2$ and wherein said helium diluted tetraethoxysilane vapor is about 1 part tetraethoxysilane to between about 2 and 3 parts helium;

reflowing said doped insulating dielectric layer;

etching away said oxide layer; and forming a patterned metal electrode onto said semiconductor substrate.

2. The method of claim 1 wherein said oxide layer is $SiO_2$ with a thickness of between about 80 and 120 Angstroms.

3. A method of forming integrated circuits, comprising the steps of:

providing a semiconductor substrate with devices formed therein;

providing a gate dielectric layer formed on said semiconductor substrate;

providing a polysilicon gate electrode formed on said gate dielectric layer;

forming a tungsten silicide layer on said polysilicon gate electrode;

forming a doped glass dielectric layer with contact openings formed therein over said semiconductor substrate;

forming an oxide layer over said doped glass dielectric layer with contact openings wherein said oxide layer is formed using chemical vapor deposition of helium diluted tetraethosxysilane vapor and $O_2$ and wherein said helium diluted tetraethoxysilane vapor is between about 1 part tetraethoxysilane to between about 2 and 3 parts helium;

reflowing said doped glass dielectric layer;

etching away said oxide layer; and forming a patterned metal electrode onto said substrate.

4. The method of claim 3 wherein said oxide layer is $SiO_2$ with a thickness of between about 80 and 120 Angstroms.

* * * * *